United States Patent
Grassl

(10) Patent No.: US 6,583,030 B1
(45) Date of Patent: Jun. 24, 2003

(54) METHOD FOR PRODUCING AN INTEGRATED CIRCUIT PROCESSED ON BOTH SIDES

(75) Inventor: Thomas Grassl, Freising (DE)

(73) Assignee: Giesecke & Devrient GmbH (DE)

( * ) Notice: Subject to any disclaimer, the term of this patent is extended or adjusted under 35 U.S.C. 154(b) by 0 days.

(21) Appl. No.: 09/856,250

(22) PCT Filed: Nov. 17, 1999

(86) PCT No.: PCT/EP99/08817

§ 371 (c)(1),
(2), (4) Date: Aug. 15, 2001

(87) PCT Pub. No.: WO00/31796

PCT Pub. Date: Jun. 2, 2000

(30) Foreign Application Priority Data

Nov. 20, 1998 (DE) .......................................... 198 53 703

(51) Int. Cl.⁷ ............................................... H01L 21/30
(52) U.S. Cl. .................. 438/459; 438/455; 438/462; 438/464; 257/679; 257/698; 257/773; 257/774
(58) Field of Search ................................. 438/107, 118, 438/455, 459, 462, 464, 667, 716, 959, 977, 152; 257/679, 698, 773, 774, 720, 347, 713, 712

(56) References Cited

U.S. PATENT DOCUMENTS

| | | | |
|---|---|---|---|
| 4,889,832 A | 12/1989 | Chatterjee | |
| 5,225,771 A | * 7/1993 | Leedy | ........................ 324/72.5 |
| 5,424,245 A | 6/1995 | Gurtler et al. | |
| 5,426,072 A | 6/1995 | Finnila | |
| 5,563,084 A | 10/1996 | Ramm et al. | |
| 5,627,106 A | * 5/1997 | Hsu | ........................... 438/459 |
| 5,767,001 A | 6/1998 | Bertagnolli et al. | |
| 5,814,889 A | * 9/1998 | Gaul | ........................... 257/773 |
| 5,825,080 A | 10/1998 | Imaoka et al. | |
| 5,851,894 A | 12/1998 | Ramm | |
| 5,877,034 A | 3/1999 | Ramm et al. | |
| 6,242,778 B1 | * 6/2001 | Marmillion et al. | ........ 257/347 |

FOREIGN PATENT DOCUMENTS

| | | |
|---|---|---|
| DE | 43 14 907 | 5/1993 |
| DE | 44 33 833 | 9/1994 |
| DE | 44 33 845 | 9/1994 |
| DE | 195 16 487 | 5/1995 |
| DE | 197 16 102 | 4/1997 |
| DE | 197 46 642 | 10/1997 |
| DE | EP 99/08817 | 11/1999 |
| WO | WO 94/17553 | 8/1994 |

* cited by examiner

Primary Examiner—Matthew Smith
Assistant Examiner—V. Yevsikov
(74) Attorney, Agent, or Firm—Bacon & Thomas, PLLC

(57) ABSTRACT

A method for producing an integrated circuit wherein a substrate is provided that includes a circuit structure and a first metalization structure disposed thereover comprising at least one layer with plated holes extending therethrough and into the circuit structure. The plated holes are insulated and a planarizing layer is disposed over the metalization structure. A handling wafer is applied over the substrate permitting the substrate to be thinned such that metalized connections disposed in the plated holes are exposed. A second metalization structure is provided and connected to the circuit structure and/or the first metalization structure by the metalized connections.

19 Claims, 2 Drawing Sheets

METHOD FOR PRODUCING AN INTEGRATED CIRCUIT PROCESSED ON BOTH SIDES

BACKGROUND OF THE INVENTION

This invention relates to a method for producing an integrated circuit processed on both sides, to a circuit produced by said method and to a module and a smart card having a thus produced circuit.

A particular problem in the production of integrated circuits in general is the wiring, which is becoming ever more complex given ever smaller structural widths and greater functionality. This means that the metalization is effected in a plurality of layers in the wiring of the chips, or the number of layers increases constantly with rising chip complexity. The difficulty arises that only a limited number of metalization layers may be disposed one on the other.

The prior art discloses vertically integrated circuits. Vertical system integration provides a method by which a chip or wafer is thinned and bonded to another chip or wafer. A method for producing a three-dimensional integrated circuit is known for example from German laid open print DE-OS 44 33 845. This is a method by which two finished substrates provided with metalization structures are interconnected. The thinned wafers are diced into individual chips and applied to the lower substrate, at least one of the substrates being subjected to a functional test before the substrates are joined for eliminating faulty chips. The metalization structure of the lower wafer is connected with the component level of the upper wafer so as to provide an integrated circuit with two or more independently produced chips.

The disadvantage of said methods is that every metalization structure is associated with a circuit structure and high alignment accuracy is required when the structures are joined or high reject rates must be accepted.

SUMMARY OF THE INVENTION

It is therefore the problem of the invention to state a method which permits wiring with reasonable effort and low reject rates even for complex integrated circuits, and to state an integrated circuit produced by said method.

This problem is solved by a method and an integrated circuit according to the present invention. Advantageous embodiments of the invention are also provided.

The essence of the invention is that a finished wafer, i.e. a substrate with a circuit structure and a metalization structure disposed thereon and preferably consisting of a plurality of layers, is rebonded to a handling wafer after the structure has been provided with plated-through holes to the wafer backside which have been insulated against the silicon. After rebonding, the first substrate is thinned from the backside so that the plated-through holes are open and the metalized connections are exposed. A second metalization structure is now produced on the chip backside and connected with the first metalization structure by means of the throughplating.

With the inventive method one can produce an integrated circuit wherein a circuit structure is provided with a metalization structure on both sides. Due to the direct processing on the thinned circuit structure the effort for positioning is no higher than with conventional one-sided metalization. This makes it possible to provide wiring even for very small structural widths, or permits such wiring.

One obtains even more exact alignment and thus a further reduction of the reject rate for the second metalization structure by etching alignment marks which are recognizable from the backside before thinning the substrate or before rebonding to the carrier wafer.

In order to avoid separate method steps for etching the alignment marks and the plated-through holes, it is advantageous to etch the plated-through holes and the alignment marks in the same method step.

Further, it has proved advantageous to metalize the plated-through holes before thinning. In this way the thinning process can be ended when the metalization of the plated-through holes is reached. Alternatively, metalization can be performed after the thinning process, in which case the thinning process is ended when the plated-through holes are reached.

When applying metalization structures on both sides for the wiring, one may further utilize the possibility for different security-relevant applications of protecting the chip from both sides with a metalization level serving as a intrusion detection screen. In this way one can produce a safe chip without requiring additional method steps for applying the intrusion detection screen.

For more extensive circuit structures it makes sense to use as the first wafer a substrate with a buried oxide layer, said oxide layer having an insulating effect so that it is possible to apply a circuit structure to both sides of the oxide layer. The backside of the substrate can be thinned after the method step of rebonding to the first handling wafer, a second circuit structure then being processed on said backside. Subsequent to the processing of the second circuit structure one can advantageously continue with the processing of the metalization structure. Subsequent to the processing of the metalization structure the wafer is planarized on the backside and rebonded to a second handling wafer so that one can continue with the processing of a metalization structure on the first circuit structure. This is necessary when the substrate with the buried oxide layer was not already provided with a metalization structure on the first circuit structure at the beginning.

In the structure with a buried oxide layer the plated-through holes are advantageously etched through and metalized before rebonding to the first handling wafer.

It should also be mentioned that in accordance with another advantageous embodiment of the invention the wafer processed on both sides can be connected with one or more further wafers processed on one or both sides to form a chip stack.

A circuit of the invention is provided by using the above-described method. Said circuit has a configuration wherein a one or multilayer metalization structure is disposed over the circuit structure and wherein a second metalization structure is further present below the circuit structure. The first and second metalization structures are interconnected by means of interchip connections.

The integrated circuit further has advantageous embodiments which result from the method steps. Thus, the integrated circuit can for example be provided on both sides with a intrusion detection screen; it can further contain a substrate with a buried substrate layer and thus two different circuit structures. Finally, the inventive integrate circuit can be stacked with further integrated circuits which are likewise processed on both sides or with one-sidedly processed circuits or wafers or chips.

A module is provided that is suitable for incorporation in a smart card and contains an integrated circuit of the invention.

A smart cart of the invention is provided that contains an integrated circuit or module.

BRIEF DESCRIPTION OF THE DRAWINGS

In the following the invention will be explained more closely with reference to FIGS. 1 and 2, in which.

DETAILED DESCRIPTION OF THE INVENTION

Figure 1A:
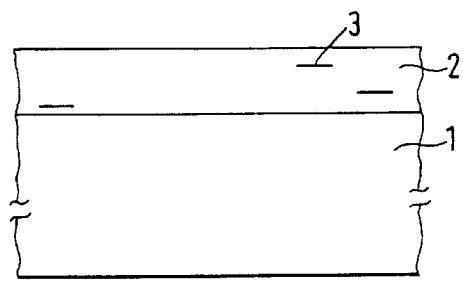
FIG. 1 shows the different production steps for an integrated circuit according to the inventive method (FIGS. 1a–1g)

FIG. 1a shows a starting substrate with silicon slice 1 already processed, i.e. provided with a circuit structure. Already applied to said silicon slice is metalization structure 2 containing wiring elements 3 and having a three-layer design in the case of FIG. 1a. One of the metalization layers, preferably the uppermost, can be designed as a intrusion detection screen. This layer makes it possible to recognize if there has been an attempt to remove the metalization layers in order to read the content of the circuit structure, for example a memory.

Figure 1B:
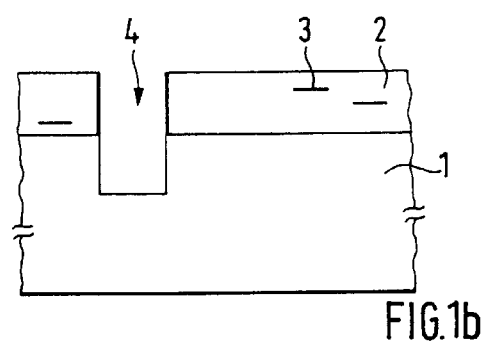

FIG. 1b shows the wafer assembly after the next method step wherein plated-through holes 4 have been etched into circuit structure 1 through metalization structure 2.

Figure 1C:
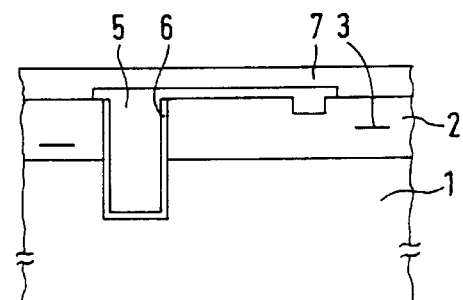
Figure 1D:
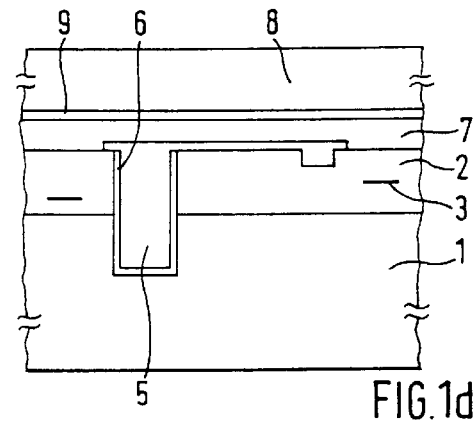

Following FIG. 1c shows the assembly after insulation of plated-through holes 4 with insulating layer 6 and after metalization with conductive material 5 to produce the later electric interchip connection. The metalization of the interchip connection can rise above metalization structure 2 and is connected with a connection of a metalization level. Further, the configuration according to FIG. 1c contains planarization level 7 which serves to level the surface of the chip for applying handling wafer 8 by means of adhesive connection 9, as shown in FIG. 1d.

Figure 1E:
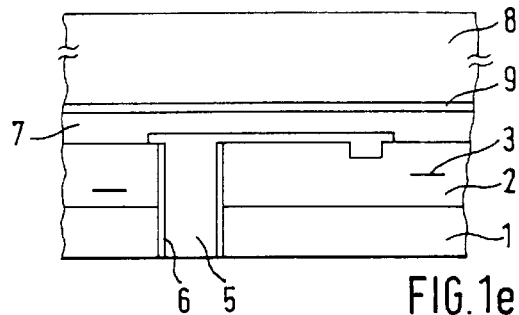

After the integrated circuit produced to this extent has been applied to handling wafer 8, backside processing can begin as shown in FIG. 1e. The first step involves the thinning of silicon slice 1, which is effected in a plurality of steps. The last thinning step consists of an etching operation which is stopped when metalization 5 is reached in accordance with the embodiment of FIG. 1. In accordance with an alternative variant, the plated-through holes are not yet metalized at this method stage so that the etching operation is stopped in this case when the metalization holes are exposed.

Figure 1F:
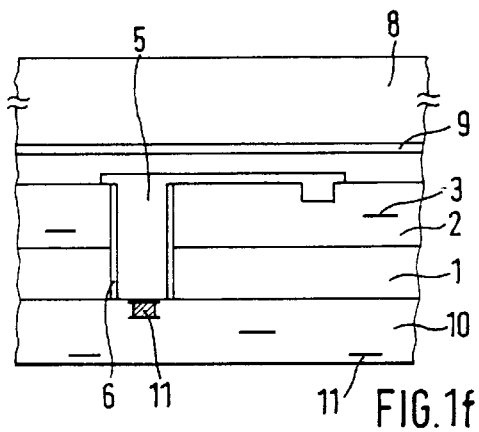

FIG. 1f shows the integrated circuit after the backside of silicon 1 was processed with metalization structure 10 with metal sheets 11. Processing is effected by layered application of the metalization levels, a connection having been made here between metalization 5 in plated-through holes 4 and connections of metalization structure 10. For alignment one can use alignment marks which are produced in the same way as plated-through holes 4. In this way the exact positional data are fixed for processing with metalization structure 10.

Figure 1G:
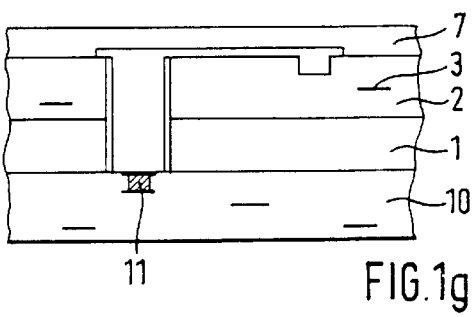

FIG. 1g finally shows a finished wafer processed on both sides after removal of handling substrate 8.

FIG. 2 shows the most important production or method steps with the use of a substrate with a buried oxide layer for the inventive method.

Figure 2A:
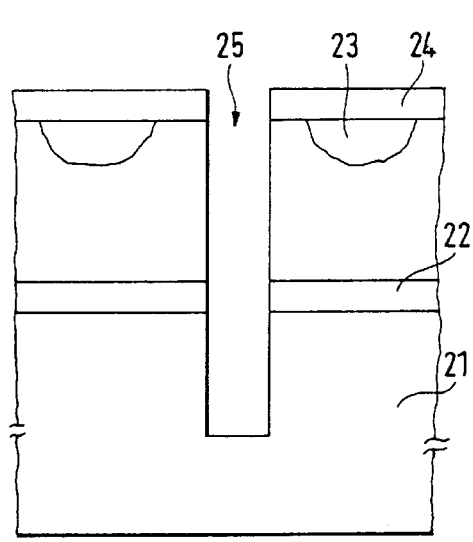
FIG. 2 shows a possible order of production for an integrated circuit with a substrate with a buried oxide layer (FIGS. 2a–2d).

FIG. 2a shows silicon slice 21 provided with buried oxide layer 22. Buried oxide layer 22 is produced for example by implanting a high oxygen dose in a monocrystalline silicon substrate so as to provide a buried $SiO_2$ layer over which a monocrystalline silicon layer is disposed. In FIG. 2a the circuit structures already disposed on the topside of buried oxide layer 22 are further symbolized by tubs 23. That is, FIG. 2a shows a wafer processed above the buried oxide layer. This figure further shows plated-through holes 25 which have preferably been produced through the buried oxide layer in a for example three-step etching method using different materials for etching which firstly allow etching in silicon and secondly etching in the buried oxide layer. Further, FIG. 2a shows planarizing layer 24 preferably consisting of a planarizing oxide.

Figure 2C:
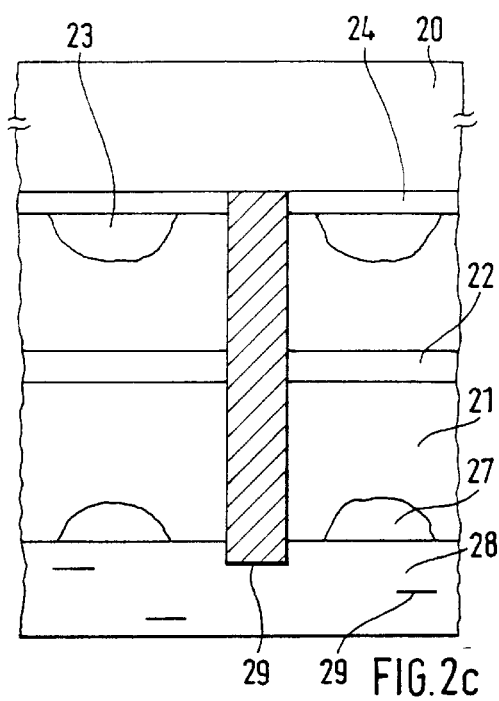
Figure 2B:
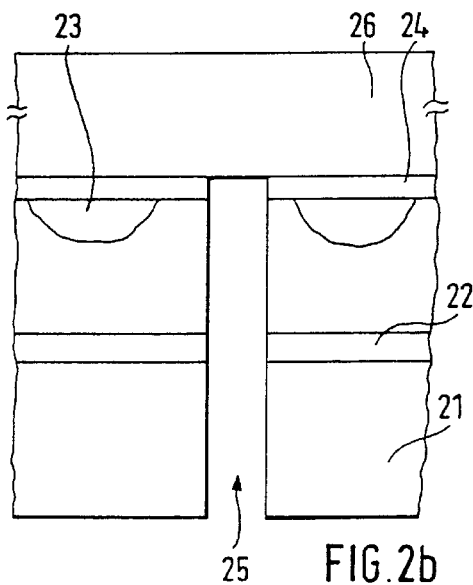

FIG. 2b shows a substrate already connected with handling wafer 26 above planarization level 23. Further, the substrate is thinned from the backside to the desired residual thickness. The silicon slice with the planarizing layer typically has a thickness of approximately 20 microns.

FIG. 2c shows substrate 2b after interchip connection 25 has been metalized and the backside of the silicon, i.e. the silicon below the oxide layer, has been processed with a circuit structure, indicated by tub 27. Further, metal structure 28 containing the conductive paths and contact areas 29 has been applied subsequently to the silicon.

Figure 2D:
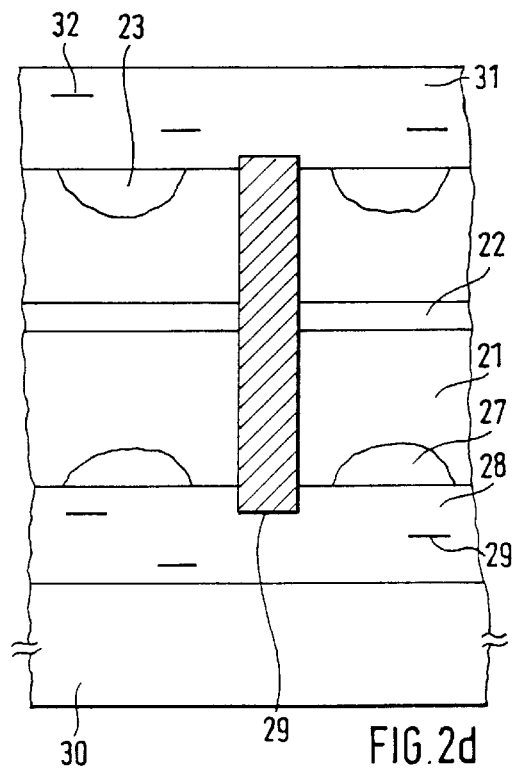

FIG. 2d shows the substrate after rebonding to second handling wafer 30 and after application of metalization structure 31.

The use of a buried oxide layer in the silicon advantageously makes it possible to produce two substantially independent circuit structures and consequently increase the integration density and functionality of the integrated circuit.

Subsequent to the representation of FIG. 2d, wafer 21, 20, 30 is saw-diced into individual chips and handling wafer 30 removed.

What is claimed is:

1. A method for producing an integrated circuit wherein a first substrate is first provided with a circuit structure (1) and a first metalization structure (2,3) disposed over a first side thereof and including one or more layers with plated holes extending therethrough and into the circuit structure (1), the plated holes (4) being insulated against the circuit structure (1) and provided with metalized connections (5), a planarizing layer (7) being disposed over the first metalization structure (2,3), the first substrate being rebonded to a handling wafer (8), a second side opposite the first side of the first substrate being thinned so that the plated holes (4) are open and metalized connections (5) are exposed, comprising producing a second metalization structure (10, 11) connected with the first metalization structure (2, 3) and/or the circuit structure (1) by means of the metalized connections (5) on the second side of the circuit structure (1).

2. The method according to claim 1, including etching alignment marks which are recognizable at least after thinning of the substrate and etched before thinning of the substrate or before rebonding to the handling wafer (8).

3. The method according to claim 2, wherein the etching of the alignment marks is effected simultaneously with the production of the plated holes (4).

4. The method according to claim 1, including metalizing the plated holes (4) before thinning and ending the thinning process when the metalization (5) of the metalized connections is reached.

5. The method according to claim 1, wherein the plated holes (4) are metalized after thinning and the thinning process is ended when the plated holes (4) are reached.

6. The method according to claim 1, wherein at least one of the first and second metalization structures (2,3,10, 11)

disposed on both sides of the circuit structure (1) has at least one metalization level serving as an intrusion detection screen.

7. The method according to claim 1, wherein the first substrate has a buried oxide layer (22) with an insulating effect, and a circuit structure (23) connected with the metalization structures disposed on both sides is provided at least on one side of the oxide layer.

8. The method according to claim 7, wherein a second circuit structure (27) is produced on the other side of the oxide layer (22) after rebonding to a first handling wafer (20) and thinning of the first substrate.

9. The method according to claim 8, wherein the backside is processed with a metalization structure (10,11, 28, 29) and planarized.

10. The method according to claim 7, wherein the first substrate is rebonded to a second handling wafer (30) and the first circuit structure (23) is provided with a metalization structure.

11. The method according to claim 7, wherein the plated-through holes (25) are etched through and metalized before rebonding to the first handling wafer (20).

12. The method according to claim 1, wherein the wafer processed on both sides is connected with one or more further wafers processed on one or both sides to form a chip stack.

13. An integrated circuit with a substrate including a circuit structure (1) and a first metalization structure (2, 3) having at least one metalization layer and disposed over a first side of the circuit structure (1), comprising:

a second metalization structure (10, 11) disposed over a second side of the circuit structure (1), the first and second metalization structures being connected by means of interchip connections;

wherein at least one metalization layer of at least one of the first and second metalization structures is an intrusion detection screen.

14. The integrated circuit according to claim 13, wherein the circuit structure (1, 23, 27) is disposed on a substrate with a buried oxide layer (22), the circuit structure being distributed over both sides of the oxide layer.

15. The integrated circuit according to claim 13, including a chip stack formed from an integrated circuit processed on both sides which is connected with one or more further chips processed on one or both sides.

16. A smart card comprising an integrated circuit or a module according to claim 13.

17. A module for incorporation in a smart card having an integrated circuit with a substrate including a circuit structure and a first metalization structure (2, 3) having at least one metalization layer and disposed over a first side of the circuit structure (1), comprising:

a second metalization structure (10, 11) disposed over a second side of the circuit structure (1), the first and second metalization structures being connected by means of interchip connections;

wherein at least one metalization layer of at least one of the first and second metalization structures is an intrusion detection screen.

18. The module according to claim 17, wherein the circuit structure of the integrated circuit is disposed on a substrate with a buried oxide layer, the circuit structure being distributed over both sides of the oxide layer.

19. The module according to claim 17, wherein the integrated circuit comprises a chip stack formed from an integrated circuit processed on both sides which is connected with one or more further chips processed on one or both sides.

* * * * *